US010367065B2

(12) United States Patent
Basu et al.

(10) Patent No.: US 10,367,065 B2
(45) Date of Patent: Jul. 30, 2019

(54) DEVICE ISOLATION FOR III-V SUBSTRATES

(71) Applicant: International Business Machines Corporation, Armonk, NY (US)

(72) Inventors: Anirban Basu, Elmsford, NY (US); Guy M. Cohen, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/040,233

(22) Filed: Jul. 19, 2018

(65) Prior Publication Data

US 2018/0350919 A1 Dec. 6, 2018

Related U.S. Application Data

(60) Division of application No. 15/608,538, filed on May 30, 2017, now Pat. No. 10,050,110, which is a (Continued)

(51) Int. Cl.
*H01L 29/205* (2006.01)
*H01L 21/02* (2006.01)
(Continued)

(52) U.S. Cl.
CPC ........ *H01L 29/205* (2013.01); *H01L 21/0251* (2013.01); *H01L 21/02178* (2013.01); (Continued)

(58) Field of Classification Search
CPC ................. H01L 29/205; H01L 21/762; H01L 21/02178; H01L 21/8252; H01L 29/207; (Continued)

(56) References Cited

U.S. PATENT DOCUMENTS 4,376,285 A 3/1983 Leonberger et al.
4,691,214 A 9/1987 Hayakawa et al.
(Continued)

FOREIGN PATENT DOCUMENTS

JP H02257653 A 10/1990

OTHER PUBLICATIONS

E. Garcia-Tabares et al., "Integration of III-V materials on silicon substrates for multi-junction solar cell applications," 2011 Spanish Conference on Electron Devices (CDE), Feb. 8-11 2011 (4 total pages).
(Continued)

*Primary Examiner* — Anthony Ho
(74) *Attorney, Agent, or Firm* — L. Jeffrey Kelly; Michael J. Chang, LLC

(57) ABSTRACT

Techniques for device isolation for III-V semiconductor substrates are provided. In one aspect, a method of fabricating a III-V semiconductor device is provided. The method includes the steps of: providing a substrate having an indium phosphide (InP)-ready layer; forming an iron (Fe)-doped InP layer on the InP-ready layer; forming an epitaxial III-V semiconductor material layer on the Fe-doped InP layer; and patterning the epitaxial III-V semiconductor material layer to form one or more active areas of the device. A III-V semiconductor device is also provided.

20 Claims, 3 Drawing Sheets

Related U.S. Application Data continuation of application No. 15/076,126, filed on Mar. 21, 2016, now Pat. No. 9,716,150, which is a division of application No. 14/298,421, filed on Jun. 6, 2014, now Pat. No. 9,318,561.

(51) Int. Cl.

| | | |
|---|---|---|
| *H01L 21/3065* | (2006.01) | |
| *H01L 29/06* | (2006.01) | |
| *H01L 21/306* | (2006.01) | |
| *H01L 21/8234* | (2006.01) | |
| *H01L 21/8252* | (2006.01) | |
| *H01L 29/207* | (2006.01) | |
| *H01L 21/762* | (2006.01) | |

(52) U.S. Cl.
CPC .. *H01L 21/02241* (2013.01); *H01L 21/02461* (2013.01); *H01L 21/02463* (2013.01); *H01L 21/02488* (2013.01); *H01L 21/02502* (2013.01); *H01L 21/02543* (2013.01); *H01L 21/02546* (2013.01); *H01L 21/3065* (2013.01); *H01L 21/30612* (2013.01); *H01L 21/762* (2013.01); *H01L 21/8252* (2013.01); *H01L 21/823431* (2013.01); *H01L 29/0684* (2013.01); *H01L 29/207* (2013.01)

(58) Field of Classification Search
CPC ....... H01L 21/30612; H01L 21/823431; H01L 21/02241; H01L 21/02461
See application file for complete search history.

(56) References Cited

U.S. PATENT DOCUMENTS

| | | | |
|---|---|---|---|
| 4,696,648 | A | 9/1987 | Slayman et al. |
| 6,036,769 | A | 3/2000 | Spurdens et al. |
| 7,202,503 | B2 | 4/2007 | Chow et al. |
| 7,560,298 | B2 | 7/2009 | Lipson |
| 2012/0223362 | A1 | 9/2012 | Belenky et al. |
| 2013/0207226 | A1 | 8/2013 | Adam et al. |
| 2013/0221326 | A1 | 8/2013 | Alberi et al. |

OTHER PUBLICATIONS

V. Narayanan et. al., "Antiphase boundaries in GaP layers grown on (001) Si by chemical beam epitaxy," Acta Materialia vol. 50, issue 6 (Apr. 2002), pp. 1275-1287.

B.J. Ohlsson, "Anti-domain-free GaP, grown in atomically flat (001) Si sub-μm-sized openings," Appl. Phys. Letters, 80 (24), pp. 4546-4548 (Jun. 2002).

R.M. Sieg, "Toward device-quality GaAs growth by molecular beam epitaxy on offcut Ge/Si1-xGex /Si substrates," J. Vac. Sci. Technol. B: Microelectronics and Nanometer Structures, vol. 16, issue 3, pp. 1471-1474 (May 1998).

Li Yang et al., "Compositionally-graded InGaAs—InGaP alloys and GaAsSb alloys for metamorphic InP on GaAs," Journal of Crystal Growth 324 pp. 103-109 (Apr. 2011).

M.K. Hudait, "High-quality $InAs_yP_{1-y}$ step-graded buffer by molecular-beam epitaxy," Appl. Phys. Lett., 82(19), pp. 3212-3214 (May 2003).

S.B. Samavedam, "High-quality germanium photodiodes integrated on silicon substrates using optimized relaxed graded buffers," Appl. Phys. Lett. 73, pp. 2125-2127 (Oct. 1998).

R. People and J.C. Bean, "Calculation of critical layer thickness versus lattice mismatch for $Ge_xSi_{1-x}$ /Si strained-layer heterostructures," Appl. Phys. Lett. 47, pp. 322-324 (Aug. 1985).

M. Uchida et al., "Fe Doping and Preparation of Semi-Insulating InP by Wafer Annealing under Fe Phosphide Vapor Pressure," 1998 International Conference on Indium Phosphide and Related Materials, pp. 377-380 (May 1998).

Huang et al., "High quality Fe-doped semi-insulating InP epitaxial layers grown by low-pressure organometallic vapor phase epitaxy using tertiarybutylphosphine," Applied Physics Letters, vol. 58, issue 2, pp. 170-172 (Jan. 1991).

Cesna et al., "Carrier trapping in iron-doped GaInP," Journal of Applied Physics, vol. 85, Issue 2, pp. 1234-1236 (Jan. 1999).

R.J. Hussey, "Characterization of Oxides Formed on InP, InGaAs, InAlAs, and InGaAs/InAlAs Heterostructures at 300-500° C.," Oxidation of Metals, Jun. 2002, vol. 57, pp. 427-447.

Premchander Perumal et al., "Investigations of the characteristics of strain-free oxidation on InAlAs epilayer lattice matched to indium phosphide," Appl. Phys. Lett., vol. 88, issue 20 201914 (May 2006) (4 total pages).

List of IBM Patents or Applications Treated as Related (2 pages).

DEVICE ISOLATION FOR III-V SUBSTRATES

CROSS-REFERENCE TO RELATED APPLICATIONS

This application is a divisional of U.S. application Ser. No. 15/608,538 filed on May 30, 2017 which is a continuation of U.S. application Ser. No. 15/076,126 filed on Mar. 21, 2016, now U.S. Pat. No. 9,716,150, which is a divisional of U.S. application Ser. No. 14/298,421 filed on Jun. 6, 2014, now U.S. Pat. No. 9,318,561, the contents of each of which are incorporated by reference herein.

FIELD OF THE INVENTION

The present invention relates to III-V semiconductor devices, and more particularly, to techniques for device isolation for III-V semiconductor substrates (such as III-V virtual substrates).

BACKGROUND OF THE INVENTION

Lattice mismatch is a factor when forming one material on another, different, material. For instance, when forming epitaxial silicon-germanium (SiGe) on a silicon substrate the crystal lattice of the silicon will serve as a template for the SiGe growth and, even though the SiGe has a larger lattice constant than silicon, the SiGe will conform to the silicon crystal lattice structure. However, this will cause strain in the SiGe layer, and that strain will increase as more SiGe is grown.

For the above-described reasons, the lattice mismatch problem remains a challenge for implementing III-V semiconductor materials in device fabrication that uses heterogeneous epitaxial layers or substrate (e.g., forming III-V epitaxial layers on a silicon substrate). To address this problem, virtual III-V on silicon substrates have been proposed where there is a gradual change in material composition starting from the silicon substrate up to a layer which has a closer matched lattice constant to a III-V material and is used for the device fabrication. For a discussion of virtual III-V substrates see, for example, E. Garcia-Tabares et al., Integration of III-V materials on silicon substrates for multi junction solar cell applications," 2011 Spanish Conference on Electron Devices (CDE), Feb. 8-11 2011; and U.S. Patent Application Publication Number 2012/0223362 A1 filed by Belenky et al., entitled "Compound Semiconductor Device on Virtual Substrate." The contents of each of these references are incorporated by reference as if fully set forth herein.

However, unlike silicon-on-insulator (SOI) substrates where device isolation is easily achieved by etching the SOI layer which rests on a buried oxide (or BOX), III-V devices that are made on virtual III-V on silicon substrates do not have a convenient way of achieving isolation.

Therefore, given the lattice mismatch challenges highlighted above, techniques for achieving device isolation for III-V devices, such as (but not limited to) those built on III-V on silicon virtual substrates would be desirable.

SUMMARY OF THE INVENTION

Techniques for device isolation for III-V semiconductor substrates are provided. In one aspect of the invention, a method of fabricating a III-V semiconductor device is provided. The method includes the steps of: providing a substrate having an indium phosphide-ready layer; forming an iron-doped indium phosphide layer on the indium phosphide-ready layer; forming an epitaxial III-V semiconductor material layer on the iron-doped indium phosphide layer; and patterning the epitaxial III-V semiconductor material layer to form one or more active areas of the device.

In another aspect of the invention, a III-V semiconductor device is provided. The device includes a substrate having an indium phosphide-ready layer; an iron-doped indium phosphide layer on the indium phosphide-ready layer; and an epitaxial III-V semiconductor material layer on the iron-doped indium phosphide layer, wherein the epitaxial III-V semiconductor material layer is patterned into one or more active areas of the device.

A more complete understanding of the present invention, as well as further features and advantages of the present invention, will be obtained by reference to the following detailed description and drawings.

DETAILED DESCRIPTION OF PREFERRED EMBODIMENTS

Figure 1:
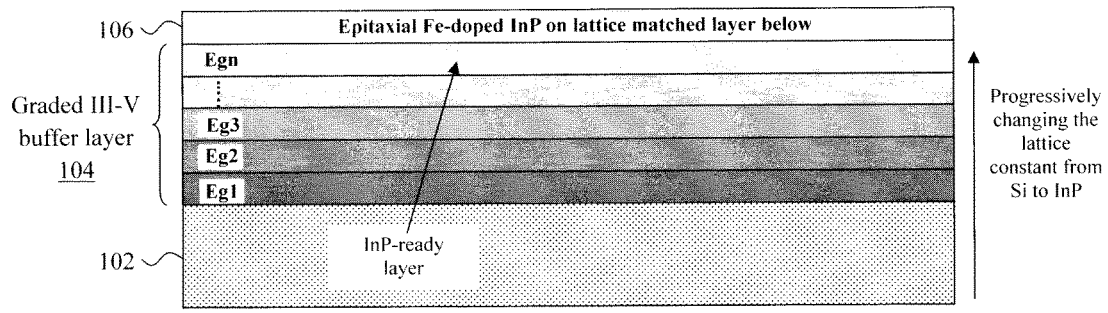
FIG. 1 is a cross-sectional diagram illustrating a starting platform for fabricating a III-V semiconductor device having an indium phosphide (InP)-ready layer on which an epitaxial iron (Fe)-doped InP layer is grown as an insulator according to an embodiment of the present invention.

FIG. 1 is a diagram illustrating an exemplary starting platform for fabricating a III-V semiconductor device, i.e., a device wherein the active area thereof is formed from a III-V semiconductor material. The term "III-V semiconductor material (or simply III-V material), as used herein and throughout the following description, refers to a material that includes at least one group III element and at least one group V element. By way of example only, suitable III-V materials include, but are not limited to, one or more of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide, indium gallium arsenide phosphide ($In_xGa_{1-x}As_yP_{1-y}$) and combinations including at least one of the foregoing materials.

As described above, lattice mismatch issues have been a challenge for implementing III-V device materials. As also described above, virtual III-V on silicon (or Ge, SiGe, etc.) substrates have been proposed as a way to provide a graded buffer layer lattice matched on one end to the underlying (e.g., silicon) substrate and on the other to a III-V material. Thus, in the example now described, a virtual III-V on silicon substrate is being used as a starting substrate. However, it is to be understood that the use of a III-V on silicon substrate is merely an example intended to illustrate the present techniques, and that any other virtual III-V (including but not limited to virtual III-V on germanium, etc.) or more generally any other suitable substrate on which formation of a III-V device material is desirable may be employed in the same manner as described herein.

As shown in FIG. 1, in this example, the virtual III-V on silicon substrate includes a silicon (Si) wafer 102 and a graded III-V buffer layer 104. As will be described in detail below, an iron (Fe)-doped indium phosphide (InP) layer will be epitaxially grown on the substrate. Thus, the goal is to produce an InP-ready layer, i.e., a layer on which InP (or a material having the same crystal structure and lattice constant as InP) can be grown as a device grade material since, as described above, lattice mismatch is a concern when growing an epitaxial III-V material, such as InP, on a silicon substrate. By "device grade material" it is meant that the material (i.e., InP or a material having the same crystal structure and lattice constant as InP) grown on the InP-ready layer (see below) is as defect free as possible (i.e., defect-free or near defect-free). Namely, crystal defects (measured for example by the number of defects per $cm^2$) can form even if the lattice constant of the seed layer is the same as the epitaxial layer. For example silicon and GaP (gallium phosphide) have almost the same lattice constant, however, it is difficult to grow GaP over Si without defects due to occurrence of antiphase boundaries (see for example, V. Narayanan et. al., "Antiphase boundaries in GaP layers grown on (001) Si by chemical beam epitaxy," Acta Materialia vol. 50, issue 6 (April 2002), pgs. 1275-1287; B. J. Ohlsson, "Anti-domain-free GaP, grown in atomically flat (001) Si sub-µm-sized openings," Appl. Phys. Letters, 80(24), p. 4546 (June 2002); and R. M. Sieg, "Toward device-quality GaAs growth by molecular beam epitaxy on offcut Ge/$Si_{1-x}Ge_x$/Si substrates," J. Vac. Sci. Technol. B: Microelectronics and Nanometer Structures, vol. 16, issue 3, pgs. 1471-1474 (May 1998), the contents of each of which are incorporated by reference as if fully set forth herein). Thus, to test if a semiconductor layer meets the criteria of a device grade material several tests can be performed. Test (1): the carrier mobility and carrier concentration of the layer under test can be measured for example using a Hall Effect measurement. Hall Effect measurement techniques are known to those of skill in the art. The layer under test would be considered to be a "device grade material" if the carrier mobility is within a few percent of the carrier mobility in a similar layer with a same carrier concentration that was formed on a native substrate. Test (2): for direct bandgap materials, the layer under test would be considered as "device grade material" if the photoluminescence (PL) of the layer under test exhibits similar spectral and intensity characteristics as an identical layer that was formed on a native substrate. The photoluminescence spectra should be measured at room temperature (300 K) and at 77 K. As is known in the art, photoluminescence measures the emission of light from a sample after the absorption of photons. Test (3): the surface roughness of the epitaxially grown layer under test, as measured for example by atomic force microscope (AFM) should be within a few percent from the roughness of an identical layer grown on a native substrate. Test (4): a p-n junction formed in the layer under test should have a similar reversed current, ideality factor, and breakdown voltage as a p-n junction formed in an identical layer that was grown on a native substrate.

One possible approach to providing an InP-ready layer, as shown in FIG. 1, is to employ a graded III-V buffer layer that has a progressive/gradual change in lattice constant from that of the underlying silicon wafer (at one side of the buffer layer) to that of InP (on the other side of the buffer layer). In general, the graded III-V buffer layer can be formed by depositing layers in a stack, one on top of the other, wherein the crystal structure of each layer is progressively more/less similar to InP/Si as one moves up the stack. As a result of this gradual progression, the top of the buffer layer provides a defect-free (or near-defect-free) InP-ready layer. According to an exemplary embodiment, the InP-ready layer is InP, indium gallium arsenide (InGaAs), or indium aluminum arsenide (InAlAs). This type of buffered wafer configuration is also referred to herein as a virtual III-V on silicon substrate. The process for forming an InP-ready layer via a graded III-V buffer layer is described, for example, in Li Yang et al., "Compositionally-graded InGaAs—InGaP alloys and GaAsSb alloys for metamorphic InP on GaAs," Journal of Crystal Growth 324 p. 103-109 (April 2011); M. K. Hudait, "High-quality $InAs_yP_{1-y}$ step-graded buffer by molecular-beam epitaxy," Appl. Phys. Lett., 82(19), p. 3212 (May 2003); and S. B. Samavedam, "High-quality germanium photodiodes integrated on silicon substrates using optimized relaxed graded buffers," Appl. Phys. Lett. 73, p. 2125 (October 1998), the contents of each of which are incorporated by reference as if fully set forth herein.

As highlighted above, the goal here is to provide an InP-ready layer on the substrate. While use of a virtual III-V on silicon substrate is one possible way to achieve an InP-ready layer, the present techniques may be employed in conjunction with any suitable process for attaining an InP-ready layer or surface. Thus, regardless of what process is used, the result is a substrate having an InP-ready layer or surface. See FIG. 1. In general, an InP-ready surface/layer is a surface or layer on which InP and other materials latticed matched to InP (such as $In_{0.53}Ga_{0.47}As$ or $In_{0.5}Al_{0.5}As$) can be epitaxially deposited without incurring substantial strain. For instance, an epitaxial layer that would be deposited over the InP-ready layer/surface would have substantially the same structural properties as if it would have been deposited over a native InP substrate. More specifically, the amount of strain developing in an epitaxial layer that is deposited over the InP-ready layer would be less than the critical threshold that would lead to a formation of a defect such as a misfit dislocation (see for example, R. People and J. C. Bean, "Calculation of critical layer thickness versus lattice mismatch for $Ge_xSi_{1-x}$/Si strained-layer heterostructures," Appl.

Phys. Lett. 47, 322 (August 1985) (hereinafter "People and Bean"), the contents of which are incorporated by reference as if fully set forth herein).

Next, as shown in FIG. L an epitaxial Fe-doped InP layer 106 is grown on the InP-ready layer. Based on the graded III-V buffer layer 106 or other suitable process to provide an InP-ready layer, the Fe-doped InP layer 106 is defect free (or near defect-free (see above)). A defect free Fe-doped InP layer can be epitaxially deposited on a native InP substrate. The quality of such a layer (measured for example by the number of defects per $cm^2$) when deposited over a virtual substrate would depend on how similar the InP-ready layer/surface is to a native InP surface. See above discussion regarding device grade materials. Fe-doped InP is generally considered to be a semi-insulator (see, for example, M. Uchida et al., "Fe Doping and Preparation of Semi-Insulating InP by Wafer Annealing under Fe Phosphide Vapor Pressure," 1998 International Conference on Indium Phosphide and Related Materials, pgs. 377-380 (May 1998), the contents of which are incorporated by reference as if fully set forth herein). For a general discussion of epitaxial growth of Fe-doped InP see, for example, Huang et al., "High quality Fe-doped semi-insulating InP epitaxial layers grown by low-pressure organometallic vapor phase epitaxy using tertiarybutylphosphine," Applied Physics Letters, vol. 58, issue 2, pgs. 170-172 (January 1991), the contents of which are incorporated by reference as if fully set forth herein. According to an exemplary embodiment, epitaxial Fe-doped InP layer 106 is grown to a thickness of from about 100 nanometers (nm) to about 10 micrometers (μm), or thicker.

When InP is doped with iron (Fe), the iron is incorporated as a mid-gap trap that sets the Fermi level to be pinned to near the center of the bandgap. As a result, the InP layer has a very low concentration of electrons and holes. This low carrier concentration is similar to an intrinsic (perfectly undoped) crystal, but much easier to achieve in practice. The Fe-doped InP is called "semi-insulating," reflecting its high resistivity of greater than 1E5 Ω·cm (e.g., 1E7 Ω·cm) (which is quite high for a semiconductor, but still lower than a true insulator like silicon dioxide ($SiO_2$)). It is notable that while iron (Fe) is chosen herein as the dopant to make semi-insulating InP, other dopants (for example chromium (Cr)) may instead be used to make semi-insulating InP, i.e., Cr-doped InP.

Next, a layer 202 of an epitaxial III-V semiconductor material is grown on the Fe-doped InP layer 106. See FIG. 2. Suitable III-V materials were provided above. According to an exemplary embodiment, the III-V material in layer 202 is indium gallium arsenide (InGaAs). As used herein, InGaAs refers to a group of compounds that include indium, gallium and arsenic, the precise composition of which can be controlled during epitaxy. To lattice match $In_xGa_{1-x}As$ to the lattice constant of InP, a composition of x=0.53 is required. A higher content of indium (for example x=0.7) may be used since $In_{0.7}Ga_{0.3}As$ has better electron transport characteristic than latticed matched InGaAs.

To insure as defect-free a layer as possible, the III-V material chosen for layer 202 is preferably a lattice match to the underlying Fe-doped InP layer 106, or made thin enough so that the strain accumulated in layer 202 is below the critical thickness for forming a dislocation (see People and Bean). For instance, when the III-V material chosen for layer 202 is InGaAs, $In_{0.53}Ga_{0.47}As$ in particular has a crystal lattice that matches Fe-doped InP. While lattice matching layer 202 to the underlying insulator (i.e., Fe-doped InP layer 106 is a consideration to achieve a high-quality active layer), in general any III-V material (including any particular InGaAs composition) may be used to form layer 202 in accordance with the present techniques. According to an exemplary embodiment, the layer 202 is formed having a thickness of from about 5 nm to about 25 nm (e.g., about 10 nm) when planar devices will be fabricated on the wafer, and from about 50 nm to about 100 nm when finFET devices will be fabricated on the wafer.

Figure 3:
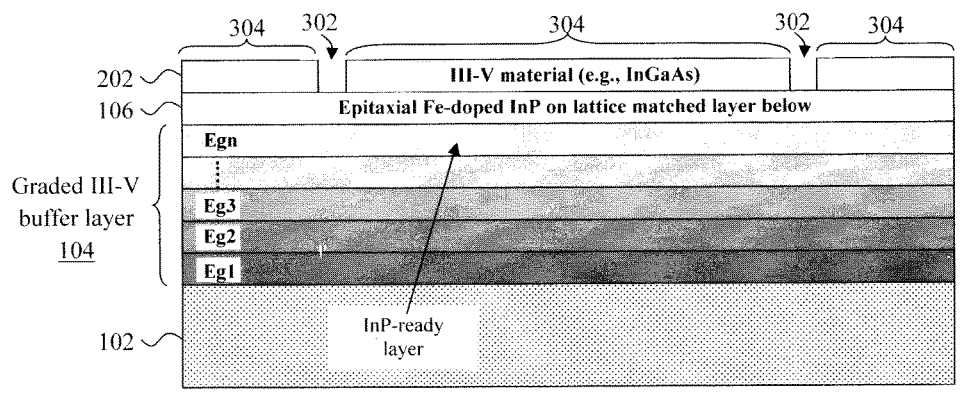
FIG. 3 is a cross-sectional diagram illustrating trenches having been patterned in the III-V semiconductor layer to form mesas in the III-V semiconductor layer which make up distinct active areas of the device in the III-V semiconductor layer according to an embodiment of the present invention.

Isolation of distinct active areas of the wafer may now be performed in a couple of different ways. In a first exemplary embodiment, active area isolation is carried out by mesa isolation. Namely, as shown in FIG. 3, trenches 302 are patterned in the III-V layer 202 to form mesas 304 in the III-V layer 202 which make up distinct active areas of the device in III-V layer 202.

Mesa isolation can be carried out using a lithography and etching process. For instance, a mask (not shown) can be formed on the III-V layer 202 with the footprint and location of the trenches 302. An etching process such as reactive ion etching can then be used to pattern the trenches 302, followed by removal of the mask. A selective etch chemistry may be used to etch the trenches in the layer 202 and stopping on the Fe-doped InP layer 106 as shown in FIG. 3. With this configuration the Fe-doped InP layer 106 acts as a buried oxide (or BOX), and the III-V mesas 304 serve as active areas of the wafer upon which, e.g., conductive lines (not shown), such as gate lines and local interconnects (not shown) can be run without forming shorts.

When the III-V layer 202 is thin, e.g., less than about 50 nm, there is a chance that the mid-gap Fe traps can electrically affect the device channel. See, for example, Cesna et al., "Carrier trapping in iron-doped GaInP," Journal of Applied Physics, vol. 85, Issue 2 (January 1999), the contents of which are incorporated by reference as if fully set forth herein. In order to avoid these Fe doping carrier traps, according to an alternative embodiment, the interface between the Fe-doped InP layer 106 and the III-V layer 202 can be passivated by the insertion of a thin buffer layer 402 therebetween. See FIG. 4.

Figure 2:
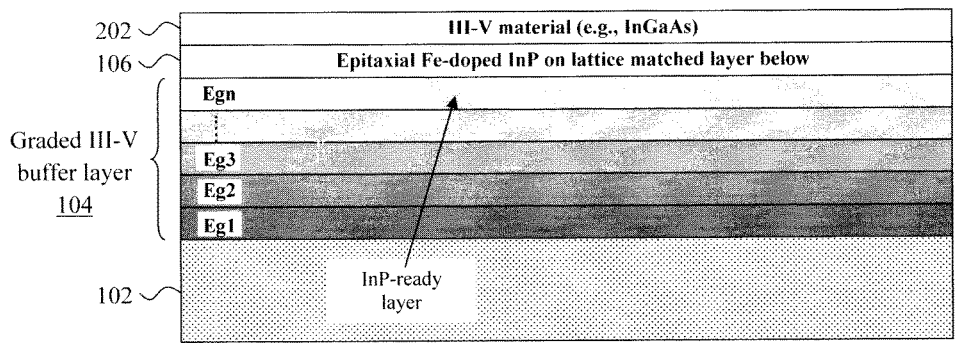
FIG. 2 is a cross-sectional diagram illustrating a layer of an epitaxial III-V semiconductor material (e.g., InGaAs) having been grown on the Fe-doped InP layer according to an embodiment of the present invention.
Figure 4:
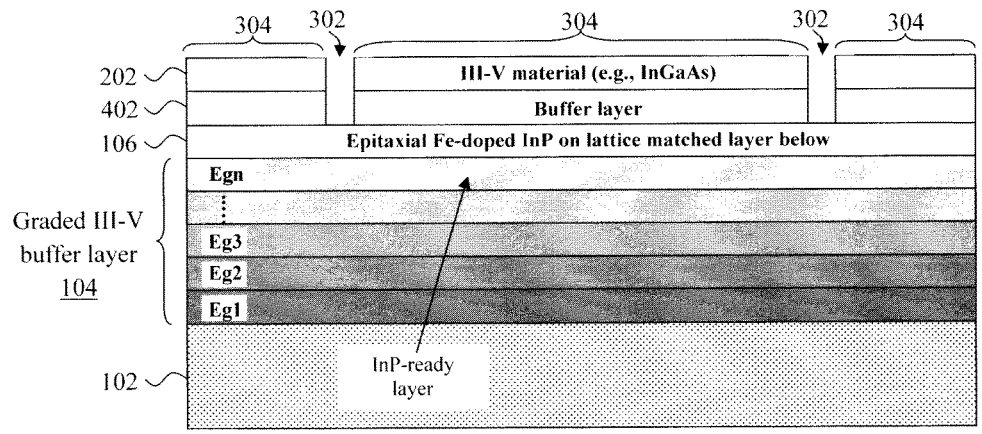
FIG. 4 is a cross-sectional diagram illustrating an alternative embodiment wherein a thin buffer layer is employed between the Fe-doped InP layer and the III-V semiconductor material to prevent Fe doping carrier traps, and trenches having been patterned in the III-V semiconductor layer/buffer layer to form mesas according to an embodiment of the present invention.

As it illustrates an alternative embodiment, FIG. 4 is intended to follow from FIG. 1 following growth of the Fe-doped InP layer 106 (and prior to the formation of the III-V layer 202 as illustrated in FIG. 2). Namely, as shown in FIG. 4, following growth of the Fe-doped InP layer 106, a thin buffer layer 402 is formed (e.g., by epitaxy) on the Fe-doped InP layer 106. Preferably, the buffer layer 402 is formed from a III-V material that is lattice matched to Fe-doped InP layer 106 to prevent the introduction of defects at this stage in the process. By way of example only, according to an exemplary embodiment, the buffer layer 402 is formed from indium aluminum arsenide (InAlAs) or intrinsic InP (i-InP) both of which are lattice matched to Fe-doped InP. The buffer layer is preferably thin, e.g., having a thickness of from about 2 nanometers (nm) to about 20 nm.

Following formation of the buffer layer 402 on the Fe-doped InP layer 106, the fabrication process can then proceed as described in detail above, to form the layer 202 of an epitaxial III-V semiconductor material, form mesa isolation trenches 302, etc. In this instance, however, the III-V layer 202 is formed on the buffer layer 402, which makes sense since the buffer layer 402 is used to passivate the interface between the Fe-doped InP layer 106 and the III-V layer 202. Further, in this particular embodiment, the trenches 302 are formed through both the III-V layer 202 and the buffer layer 402 (stopping on the Fe-doped InP layer 106. See FIG. 4.

Figure 5:
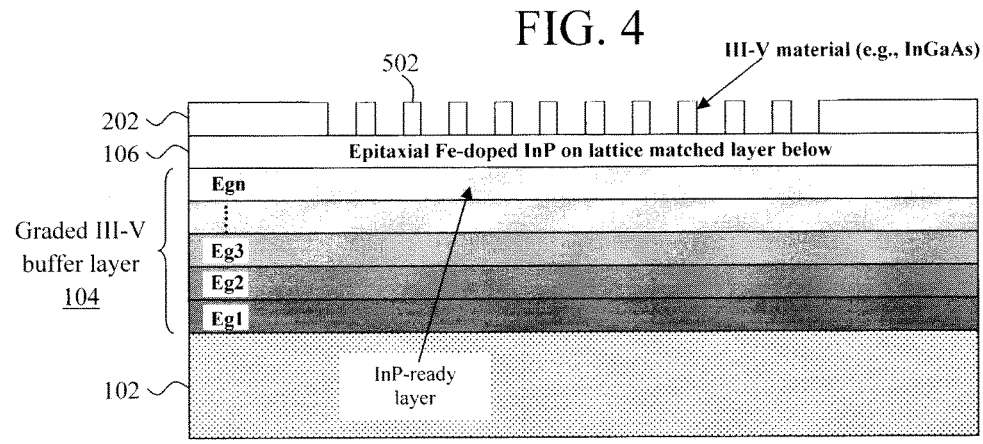
FIG. 5 is a cross-sectional diagram illustrating an alternative isolation embodiment wherein the III-V semiconductor layer has been patterned into one or more fin-shaped channels according to an embodiment of the present invention.

Active area isolation by patterned mesas, as described in conjunction with FIGS. 3 and 4 above, may be used in the case of planar devices. Isolation methods are also provided herein for use in tri-gate/finFET devices. As is known in the art, tri-gate and finFET devices include one or more fin-shaped channels interconnecting source and drain regions of the devices. In this case, the III-V layer 202 is patterned to form the fins. See FIG. 5.

For instance, a lithography and etching process (as described above) can be used to pattern one or more fins 502 in the III-V layer 202. In the example shown in FIG. 5, the patterned fins 502 are present over the (insulator) Fe-doped InP layer 106. Standard processing can then be used to form source, drain and gate electrodes (not shown) to the fin channels 502.

Figure 6:
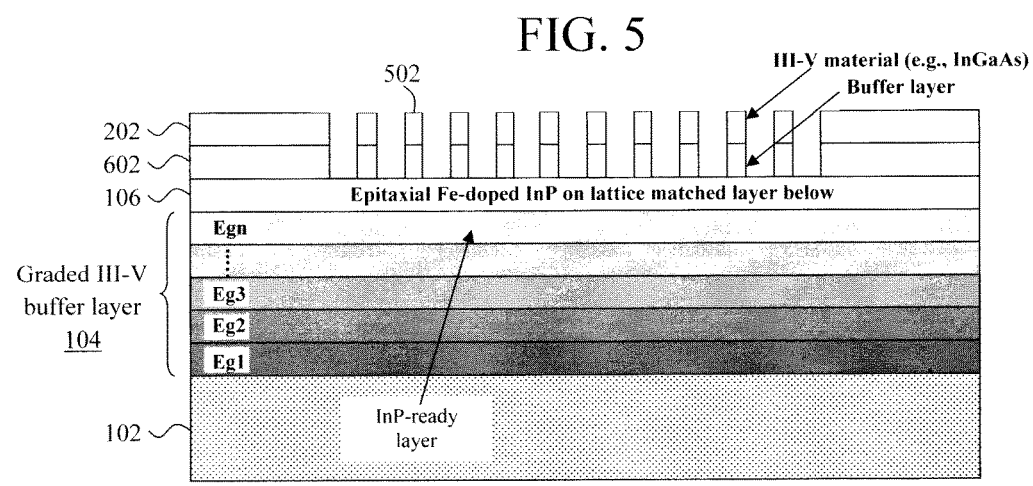
FIG. 6 is a cross-sectional diagram illustrating another alternative embodiment involving use of a thin buffer layer between the Fe-doped InP layer and the III-V semiconductor material, and fins having been patterned in the III-V semiconductor layer and the buffer layer to form fin-shaped channels according to an embodiment of the present invention.

As provided above, Fe doping carrier traps can be avoided through the use of a thin buffer layer at the interface between the III-V layer 202 and the Fe-doped InP layer. As shown in FIG. 6, this buffer layer 602 can be employed with the tri-gate/finFET configuration.

As it illustrates an alternative embodiment, FIG. 6 is intended to follow from FIG. 1 following growth of the Fe-doped InP layer 106 (and prior to the formation of the III-V layer 202 as illustrated in FIG. 2). Namely, as shown in FIG. 6, following growth of the Fe-doped InP layer 106, a thin buffer layer 602 is formed (e.g., by epitaxy) on the Fe-doped InP layer 106. Preferably, the buffer layer 602 is formed from a III-V material that is lattice matched to Fe-doped InP layer 106. According to an exemplary embodiment, the buffer layer 602 is formed from InAlAs or intrinsic InP (i-InP) both of which are lattice matched to Fe-doped InP. As described above, the buffer layer is preferably thin, e.g., having a thickness of from about 2 nm to about 20 nm.

Following formation of the buffer layer 602 on the Fe-doped InP layer 106, the fabrication process can then proceed as described in detail above, to form the layer 202 of an epitaxial III-V semiconductor material, form fins 502, etc. In this instance, however, the III-V layer 202 is formed on the buffer layer 602 so that the buffer layer 602 can passivate the interface between the Fe-doped InP layer 106 and the III-V layer 202. Further, in this particular embodiment, the fins 502 are formed in the III-V layer 202 and the buffer layer 602. See FIG. 6.

It is notable that while the patterning of mesas for isolation in planar devices and the patterning of fins for non-planar tri-gate/finFET devices are shown in the figures being performed on different wafers, this is done is merely for ease and clarity of depiction. If so desired, the present techniques may be employed in the same manner described to form the Fe-doped InP layer, optional buffer layer, III-V material layer, and to pattern both mesas and fins in the same wafer.

As provided above, one goal of the present techniques is to achieve isolation in III-V semiconductor devices by way of a Fe-doped InP layer (on an InP-ready layer). Optionally, in the embodiments employing a buffer layer (see, for example, FIGS. 4 and 6, described above) to get additional isolation, the buffer layer can be converted to an insulator (e.g., through oxidation). By way of example only, as provided above, a suitable material for the buffer layer is InAlAs. InAlAs can be oxidized to form aluminum oxide ($Al_2O_3$), an insulator. Aluminum, in particular, more readily oxidizes than the other materials contemplated herein (such as InGaAs for the III-V layer 202) and thus is easily oxidized selective to these other materials. Thus, according to an exemplary embodiment, the buffer layer is formed from InAlAs and following patterning of the mesas 304 in the III-V layer/buffer layer (as shown in FIG. 4) and/or following patterning the fins 502 in the III-V layer/buffer layer (as shown in FIG. 6), the wafer can be exposed to oxidizing ambient for a period of time sufficient to oxidize the InAlAs buffer layer to aluminum oxide (selective to the other materials). The oxidation rates for InAlAs, InP and InGaAs are detailed, for example, in R. J. Hussey, "Characterization of Oxides Formed on InP, InGaAs, InAlAs, and InGaAs/InAlAs Heterostructures at 300-500° C.," Oxidation of Metals, June 2002, Vol 57, p. 427 (hereinafter "Hussey"), the contents of which are incorporated by reference as if fully set forth herein. As described in Hussey, InAlAs is preferentially oxidized in an oxidizing ambient with good selectivity to InP and InGaAs with a ratio of oxide thicknesses InP:InGaAs:InAlAs being 1:1:80. The oxidation rate of InAlAs as a function of temperature can also be found in FIG. 1 of Premehander Perumal et al., "Investigations of the characteristics of strain-free oxidation on InAlAs epilayer lattice matched to indium phosphide," Appl. Phys. Lett., vol 88, issue 20 201914 (May 2006), the contents of which are incorporated by reference as if fully set forth herein.

Figure 7:
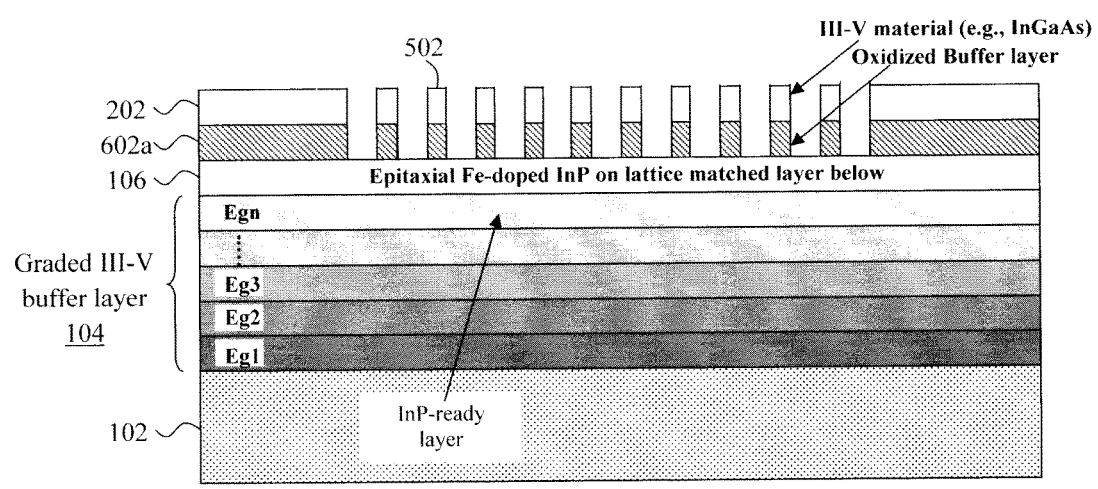
FIG. 7 is a cross-sectional diagram, following from FIG. 6, which illustrates an optional process of oxidizing the buffer layer to achieve a further level of isolation of the fins according to an embodiment of the present invention.

This additional, optional step of selectively oxidizing the buffer layer is shown illustrated in FIG. 7. The example shown in FIG. 7 is that involving fin isolation (for non-planar tri-gate/finFET devices). However, as described above, the same process applies to mesa isolation in planar device configurations. As shown in FIG. 7, following patterning of the fins 502 in the III-V layer 202 and buffer layer 602, the buffer layer is oxidized in an oxygen ambient to form oxide insulator 602a. FIG. 7 is meant to follow from FIG. 6 (i.e., oxidation of the buffer layer is performed after fins have been patterned in the III-V layer/buffer layer.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a III-V semiconductor device, the method comprising the steps of:
   providing a substrate having an indium phosphide-ready layer;
   forming an iron-doped indium phosphide layer on the indium phosphide-ready layer;
   forming an epitaxial III-V semiconductor material layer on the iron-doped indium phosphide layer; and
   patterning the epitaxial III-V semiconductor material layer to form one or more active areas of the device, wherein the epitaxial III-V semiconductor material layer is patterned to form one or more fins which comprise the one or more active areas of the device.

2. The method of claim 1, wherein the iron-doped indium phosphide layer has a resistivity of greater than 1E5 Ω·cm.

3. The method of claim 1, wherein the epitaxial III-V semiconductor material layer comprises indium gallium arsenide with an indium composition configured to lattice match the indium gallium arsenide to a lattice constant of indium phosphide.

4. The method of claim 1, further comprising the steps of:
   forming a buffer layer on the iron-doped indium phosphide layer such that the buffer layer is present between the iron-doped indium phosphide layer and the epitaxial III-V semiconductor material layer; and
   patterning the epitaxial III-V semiconductor material layer and the buffer layer to form the one or more active areas of the device.

5. The method of claim 4, wherein the buffer layer comprises indium aluminum arsenide or intrinsic indium phosphide.

6. The method of claim 4, further comprising the step of:
   oxidizing the buffer layer to convert the buffer layer to an insulator.

7. The method of claim 6, wherein the buffer layer is indium aluminum arsenide which is converted via the oxidizing into an aluminum oxide insulator.

8. The method of claim 6, wherein the oxidizing of the buffer layer is selective with respect to the iron-doped indium phosphide layer and the epitaxial III-V semiconductor material layer.

9. The method of claim 1, wherein the substrate comprises a graded III-V buffer layer on a silicon substrate, wherein a portion of the graded III-V buffer layer is the indium phosphide-ready layer, and wherein the indium phosphide-ready layer comprises indium phosphide, indium gallium arsenide, or indium aluminum arsenide.

10. The method of claim 1, wherein the epitaxial III-V semiconductor material layer comprises a material selected from the group consisting of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide, indium gallium arsenide phosphide and combinations comprising at least one of the foregoing materials.

11. The method of claim 1, wherein the epitaxial III-V semiconductor material layer comprises indium gallium arsenide.

12. A method of fabricating a III-V semiconductor device, the method comprising the steps of:
   providing a substrate having an indium phosphide-ready layer;
   forming an iron-doped indium phosphide layer on the indium phosphide-ready layer;
   forming an epitaxial III-V semiconductor material layer on the iron-doped indium phosphide layer;
   forming a buffer layer on the iron-doped indium phosphide layer such that the buffer layer is present between the iron-doped indium phosphide layer and the epitaxial III-V semiconductor material layer; and
   patterning the epitaxial III-V semiconductor material layer to form one or more active areas of the device, wherein the epitaxial III-V semiconductor material layer is patterned to form one or more fins which comprise the one or more active areas of the device.

13. The method of claim 12, wherein the iron-doped indium phosphide layer has a resistivity of greater than 1E5 $\Omega\cdot$cm.

14. The method of claim 12, wherein the epitaxial III-V semiconductor material layer comprises indium gallium arsenide with an indium composition configured to lattice match the indium gallium arsenide to a lattice constant of indium phosphide.

15. The method of claim 12, further comprising the step of:
   patterning the epitaxial III-V semiconductor material layer and the buffer layer to form the one or more active areas of the device.

16. The method of claim 12, wherein the buffer layer comprises indium aluminum arsenide or intrinsic indium phosphide.

17. The method of claim 12, further comprising the step of:
   oxidizing the buffer layer to convert the buffer layer to an insulator.

18. The method of claim 17, wherein the buffer layer is indium aluminum arsenide which is converted via the oxidizing into an aluminum oxide insulator.

19. The method of claim 17, wherein the oxidizing of the buffer layer is selective with respect to the iron-doped indium phosphide layer and the epitaxial III-V semiconductor material layer.

20. The method of claim 12, wherein the epitaxial III-V semiconductor material layer comprises a material selected from the group consisting of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide, indium gallium arsenide phosphide and combinations comprising at least one of the foregoing materials.

* * * * *